United States Patent
Kwan et al.

(10) Patent No.: US 10,591,296 B2
(45) Date of Patent: Mar. 17, 2020

(54) LASER LEVELING TOOL WITH ADAPTIVE THERMAL CONTROL

(71) Applicant: Robert Bosch Co. Ltd., Hong Kong (CN)

(72) Inventors: Yat Shan Kwan, Hong Kong (CN); Wah Pong Chan, Hong Kong (CN); Eric Hung-Ying Yuen, Hong Kong (CN)

(73) Assignee: Robert Bosch Co., Ltd., Hong Kong (CN)

( * ) Notice: Subject to any disclaimer, the term of this patent is extended or adjusted under 35 U.S.C. 154(b) by 209 days.

(21) Appl. No.: 15/661,106

(22) Filed: Jul. 27, 2017

(65) Prior Publication Data

US 2018/0120103 A1    May 3, 2018

(30) Foreign Application Priority Data

Jul. 28, 2016   (CN) .......................... 2016 1 0605537

(51) Int. Cl.
| | |
|---|---|
| *G01C 9/06* | (2006.01) |
| *G01C 15/00* | (2006.01) |
| *G01C 15/10* | (2006.01) |
| *G01K 13/00* | (2006.01) |
| *G01R 31/36* | (2020.01) |

(52) U.S. Cl.
CPC ............. *G01C 9/06* (2013.01); *G01C 15/004* (2013.01); *G01C 15/105* (2013.01); *G01K 13/00* (2013.01); *G01C 2009/066* (2013.01); *G01R 31/3648* (2013.01)

(58) Field of Classification Search
CPC .. G01C 15/004; G01C 2009/066; G01C 9/06; G01C 15/002; G01C 9/12; G01C 15/105; G01B 7/30
USPC ........................................................... 33/290
See application file for complete search history.

(56) References Cited

U.S. PATENT DOCUMENTS

| | | | |
|---|---|---|---|
| 4,221,483 A | 9/1980 | Rando | |
| 6,583,860 B2 * | 6/2003 | Haga ..................... | G01S 7/4813 33/298 |
| 6,621,560 B2 * | 9/2003 | Greco .................. | G01B 21/045 33/366.11 |
| 6,628,373 B2 * | 9/2003 | Kahle .................. | G01C 15/002 33/366.11 |
| 6,688,011 B2 * | 2/2004 | Gamal ................. | G01C 15/004 33/281 |
| 7,099,000 B2 * | 8/2006 | Connolly ............. | G01C 15/002 33/285 |
| RE40,230 E * | 4/2008 | Kneissi ................. | B82Y 20/00 372/50.1 |
| 7,395,604 B2 * | 7/2008 | Chien .................. | G01C 15/004 33/290 |

(Continued)

FOREIGN PATENT DOCUMENTS

WO        95/33972 A1    12/1995

*Primary Examiner* — Yaritza Guadalupe-McCall
(74) *Attorney, Agent, or Firm* — Maginot, Moore & Beck LLP

(57) ABSTRACT

A laser leveling tool comprises at least one laser diode for emitting a laser beam; a micro controller unit for controlling the operation of the laser diode; and a thermal sensor for sensing the internal temperature of the laser leveling tool; wherein the micro controller unit is configured to reduce the operation power of the laser diode when the sensed internal temperature reaches a temperature threshold.

12 Claims, 3 Drawing Sheets

(56) References Cited

U.S. PATENT DOCUMENTS

| | | | |
|---|---|---|---|
| 7,793,424 B2 * | 9/2010 | Laabs | G01C 15/002 33/290 |
| 2003/0145474 A1 * | 8/2003 | Tacklind | G01C 15/004 33/290 |
| 2006/0165142 A1 * | 7/2006 | Robinson | H01S 5/0014 372/38.07 |
| 2006/0218805 A1 * | 10/2006 | Greco | G01B 21/045 33/291 |
| 2006/0272167 A1 * | 12/2006 | Chien | G01C 9/00 33/286 |
| 2009/0059978 A1 * | 3/2009 | Nagashima | G11B 7/126 372/34 |
| 2009/0080903 A1 * | 3/2009 | Moriyasu | H04B 10/572 398/182 |
| 2009/0141756 A1 * | 6/2009 | Hiremath | H01S 5/024 372/34 |
| 2010/0064534 A1 * | 3/2010 | Schumacher | G01C 15/004 33/228 |
| 2010/0201895 A1 * | 8/2010 | Golub | A61B 5/0059 348/759 |
| 2013/0097882 A1 * | 4/2013 | Bridges | G01B 11/005 33/503 |
| 2014/0182147 A1 * | 7/2014 | Munroe | G01B 11/26 33/275 R |
| 2014/0202011 A1 * | 7/2014 | Munroe | G01B 11/26 33/228 |
| 2016/0209168 A1 * | 7/2016 | Sharrah | F41G 11/004 |
| 2017/0199276 A1 * | 7/2017 | Liu | G01S 17/36 |
| 2018/0120103 A1 * | 5/2018 | Kwan | G01C 9/06 |

\* cited by examiner

LASER LEVELING TOOL WITH ADAPTIVE THERMAL CONTROL

BACKGROUND OF THE INVENTION

The disclosure relates to a laser leveling tool with adaptive thermal control function.

Laser leveling tools are generally used in construction and other fields. A laser leveling tool may comprise one or more laser diodes for generating laser lines. Over the past couple of years, the cost of high power red laser diodes dropped steadily. Therefore, high power laser diodes were used to increase laser line visibility. At the same time, more and more laser diodes were used in a laser leveling tool to form more laser lines. Higher laser diode power and more laser diodes in a product increase the thermal load of the products.

With the advance of laser diode manufacturing technologies, green laser diodes of various output power became available recently. Due to the higher energy photons of green laser radiation, the bias voltage of green laser diode is also higher, in the range of 6.0 V to 8.0 V. This is about three times higher than the 640 nm red laser diodes which need about 2.5 V forward bias voltage. This higher bias voltage results in more waste heat production as well as more power consumption.

Therefore, the use of high power red laser diode or green laser diode reduces the operation temperature envelop of laser leveling products and shorten the battery life. The waste heat of laser diode becomes an issue when the ambient temperature of the tool is high.

Recently, many laser leveling product manufacturers started release products using green laser diodes. All these products operated the laser diode in fixed pulsed mode, at 50% duty cycle at frequencies ranging from 5 kHz to 10 KHz. Operate the laser diodes at 50% duty cycle will reduce the thermal loading by about 60% (assuming a 90% switch mode power supply efficiency) as well as extending the battery life. The disadvantage is that the laser line visibility is also reduced by 50%.

SUMMARY OF THE INVENTION

An object of the disclosure is to extend the operation temperature envelop of the laser leveling products.

For this end, there provides a laser leveling tool which comprises at least one laser diode for emitting a laser beam; a micro controller unit (MCU) for controlling at least the operation of the laser diode; and a thermal sensor for sensing the internal temperature of the laser leveling tool; wherein the MCU is configured to reduce the operation power of the laser diode when the sensed internal temperature reaches a temperature threshold.

According to a possible embodiment, the temperature threshold is 10 to 25° C. lower than the permitted highest operation temperature of the laser diode. For example, the temperature threshold is about 45° C.

According to a possible embodiment, the temperature threshold includes at least two different temperature thresholds corresponding to different operation power levels of the laser diode, and the MCU is configured to reduce the operation power of the laser diode to a corresponding operation power levels when the sensed internal temperature reaches one of the temperature thresholds.

According to a possible embodiment, the operation power of the laser diode is reduced by lowering down the operation duty cycle or the electric current of the laser diode.

According to a possible embodiment, the laser leveling tool further comprises a battery (12) as the power source of the laser leveling tool, wherein the MCU is further configured to reduce the operation power of the laser diode when the remaining capacity of the battery is reduced to a battery capacity threshold.

According to a possible embodiment, the MCU is further configured to require the user's permission before it initiates the power reduction of the laser diode.

According to a possible embodiment, the MCU is further configured to calculate the permitted operation time for the remaining battery capacity under a certain operation power of the laser diode.

According to a possible embodiment, the laser diode comprises one or more laser diodes mounted to a pendulum, and the thermal sensor is attached to the pendulum or mounted to be near the pendulum to measure the temperature of the pendulum or the temperature in the proximity of the pendulum.

According to a possible embodiment, the laser leveling tool further comprises an adaptive thermal control firmware stored in the MCU or in a memory that can be read by the MCU for reducing the operation power of the laser diode based on the sensed internal temperature.

According to a possible embodiment, the laser leveling tool is of the self-leveling type, comprising a seat having adjustable legs for adjusting the orientation of the laser leveling tool.

According to a possible embodiment, the laser leveling tool further comprises a user selectable control interface for selecting the operation mode of the laser leveling tool, the user selectable control interface comprising one or more of:

a human-machine interface (HMI) provided on a main body of the laser leveling tool;

an IRDA or RF type remote control interface;

Bluetooth or WiFi connectivity for establishing communication with a smartphone with customized APPs.

According to the disclosure, an adaptive firmware is incorporated which actively reduces the operation power of the laser leveling tool when the internal temperature of it reaches a temperature threshold to avoid further temperature increasing, so the operation envelop of the laser leveling tool can be extended and the battery life can be extended, while the laser line visibility can be maintained at a certain high level in a longer operation time.

BRIEF DESCRIPTION OF THE DRAWINGS

The above and other aspects of the disclosure will be understood and appreciated more completely by reading the detailed description below with reference to the drawings in which.

DETAILED DESCRIPTION

Some possible embodiments of the disclosure will be described now.

Figure 1:
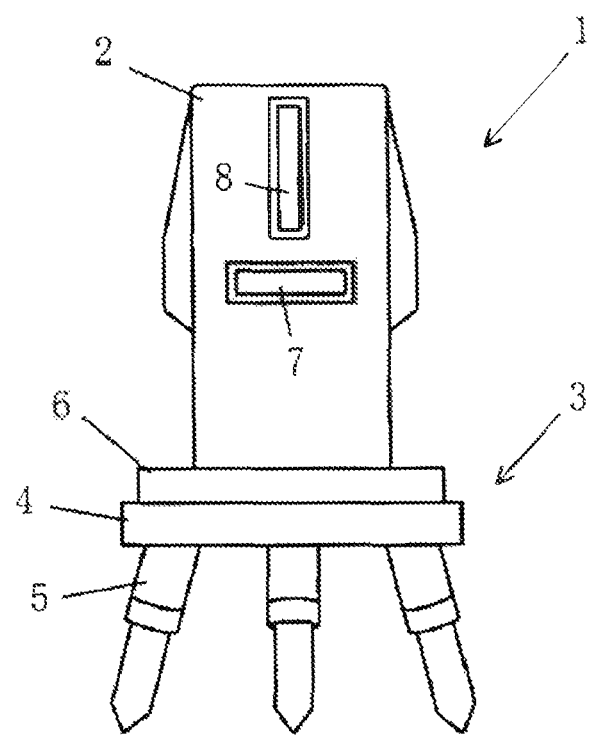
FIG. 1 is a schematic front view of a laser leveling tool according to a possible embodiment of the disclosure.

With reference to FIG. 1, a laser leveling tool 1 of the disclosure comprises a tool main body (bare tool) 2 supported by a seat 3. The seat 3 comprises a platform 4, three adjustable legs 5 extending downwards from the platform 4, and a turn table 6 mounted on the platform 4. The tool main body 2 is removably attached to the turn table 6. The orientation of the tool main body 2 can be changed by adjusting the height of the at least one of the legs.

The tool main body 2 comprises a horizontal laser beam window 7 through which a horizontal laser plane can be emitted out, and one or more vertical laser beam window 8 through which vertical laser planes can be emitted out. Laser lines are generated on objective surfaces when the laser planes are projected onto these surfaces.

Figure 2:
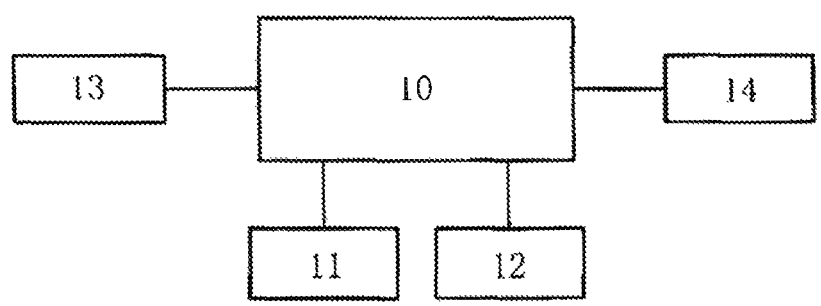
FIG. 2 is a block diagram of a controller unit of the laser leveling tool shown in FIG. 1.

As shown in FIG. 2, the tool main body 2 comprises a micro controller unit (MCU) 10 for controlling the operation of it. The MCU 10 is connected with laser diodes 11 for generating the laser planes, a battery 12 for powering the tool main body 2, a thermal sensor 13 for sensing the internal temperature of the tool main body 2, and a human-machine interface (HMI) 14 provided on the tool main body 2.

The laser leveling tool 1 further comprises a pendulum (not shown) supported in the tool main body 2 via a universal joint, and the laser diodes 11 are mounted on the pendulum, so the heat generated during operation is likely transferred to the pendulum. The laser diodes 11 may be red laser diodes, green laser diodes or laser diodes emitting other colors. The thermal sensor 13 may also mounted to the pendulum, and the temperature at the pendulum may be used as a parameter in controlling the operation of the laser leveling tool 1.

In the operation of the laser leveling tool 1, the laser diodes 11 generates heat which is built up inside the tool main body 2, especially at the pendulum. For avoiding performance (for example visibility of the generated laser lines) reduction and protecting the laser leveling tool 1 from damaged under high internal temperature, the MCU 10 performs active thermal control to the operation of the laser diodes 11.

Specifically, as soon as the laser leveling tool 1 is turned on or is wake-up from sleep mode, the MCU 10 reads the measured temperature of the thermal sensor 13. If the measured temperature is below a pre-determined limit, for example, about 45° C., the MCU 10 controls the laser diodes 11 to operate at full output power. As the internal temperature rises due to waste heat build-up or the ambient temperature condition changes, the MCU 10 continuously monitors the change of the internal temperature. If the internal temperature reaches the pre-determined level, the MCU 10 reduces the operation power of the laser diodes 11, for example, by reducing the electric current or operation duty cycle (changed to pulse mode) of them. The power reduction can be performed in a single stage or multiple stages, depending on the product specification, types and number of laser diodes used for certain products. The power reduction can also be triggered by the remaining capacity of the battery 12 in order to extend the battery life. The remaining capacity of the battery 12 can be detected by a battery management module in the MCU 10. In many cases, if the laser leveling tool 1 is used for less than half an hour, the internal temperature will not reach the limits for triggering the power reduction.

Figure 3:
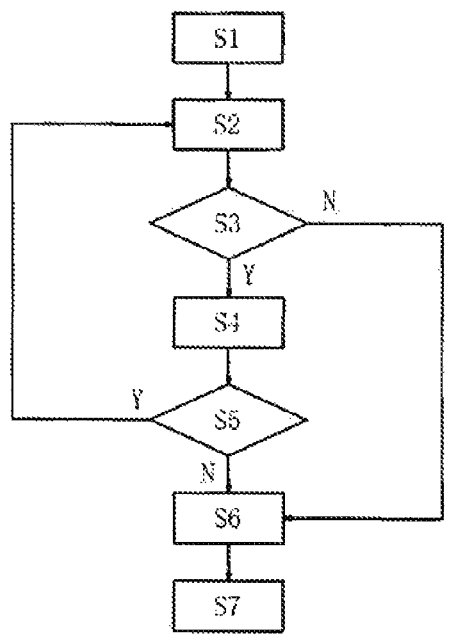
FIG. 3 is a flow chart showing a thermal control program conducted in the controller unit shown in FIG. 2.

FIG. 3 shows by a simplified flow chart an adaptive or active thermal control program that can be performed in the MCU 10, which comprises the steps described below.

In step S1, the operation of the laser leveling tool 1 is started.

Then, in step S2, the measured temperature of the thermal sensor 13 is read.

Then, in step S3, it judges whether the measured temperature is lower than a temperature threshold which may be 10 to 25° C. lower than the permitted highest operation temperature of the laser diodes 11, for example, about 45° C.; if the answer is NO, then the program goes to step S6, and if the answer is YES, the program goes to step S4.

In step S4, the remaining capacity of the battery 12 is detected.

Then, in step S5, it judges whether the remaining capacity of the battery 12 is higher than a battery capacity threshold, for example, about 40% of the full battery capacity; if the answer is YES, then the program goes back to step S2, and if the answer is NO, the program goes to step S6.

In step S6, power reduction is triggered, so the laser diodes 11 operate at reduced output power.

Then, in step S7, the operation of the laser leveling tool 1 is ended. The end of the operation of the laser leveling tool 1 may be a result of the laser leveling tool 1 being turned off or the battery 12 being run off.

The above described adaptive or active thermal control can be modified according to requirements. For example, multi-stage power reduction may be adopted, in which different temperature thresholds and/or battery capacity thresholds are used in determining the operation power level. For example, when a first temperature threshold is reached, the operation power is reduced to a first level; and then, if a second higher temperature threshold is reached, the operation power is further reduced to second level which is lower than the first level; and so on. In this way, the internal temperature can be maintained in a normal range for laser line visibility and tool safety.

Further, the battery capacity may not be considered in the program. In this case, power reduction is triggered only in responsive to the temperature threshold(s), and the battery can be simply changed or recharged once it runs out.

Further, the above program may be modified in step S6 by adding a sub-step of asking the user whether to trigger power reduction or not. The power reduction is triggered only the user inputs confirmative instruction; otherwise, the output power will remain unchanged. For this purpose, the MCU 10 may be configured to calculate the permitted operation time for the remaining battery capacity under each operation power so the user can decide whether it is necessary to trigger power reduction or not.

The program described above or any similar programs that can perform adaptive or active thermal control to the laser leveling tool 1 can be stored, for example, in the form of an adaptive thermal control firmware, in the MCU 10 or a memory that can be read by the MCU 10 for reducing the operation power of the laser diodes when the internal temperature of the laser leveling tool 1 is sensed to be beyond the temperature threshold.

Figure 4:
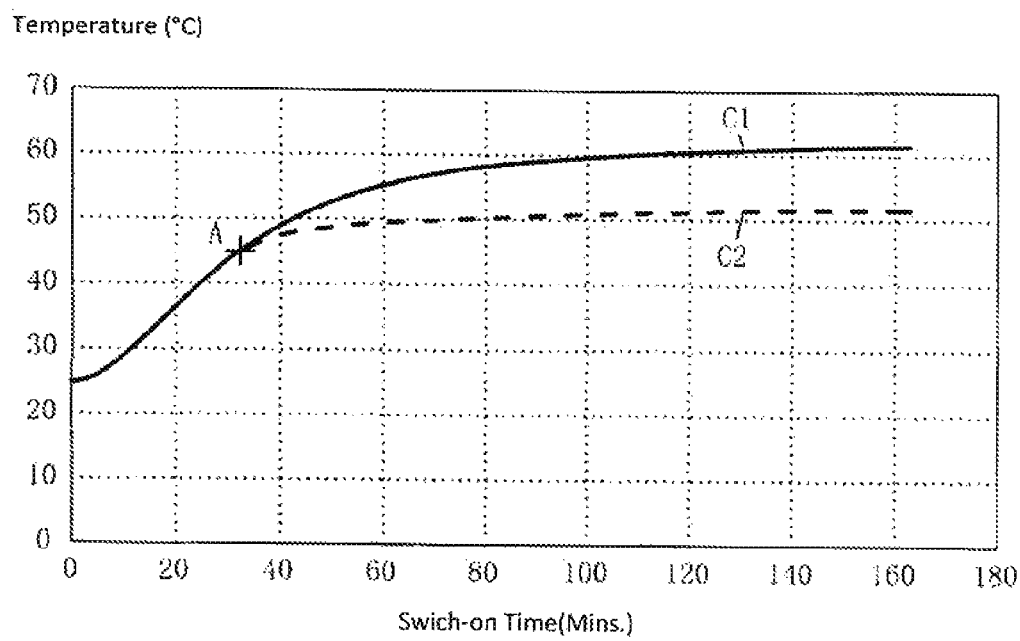
FIG. 4 is a graph showing the thermal control effect of the disclosure.

A test has been conducted for checking the effect of the adaptive thermal control in the laser leveling tool 1. A typical laser leveling tool without adaptive thermal control as a comparative example and the laser leveling tool 1 of the disclosure are both set in an environment with room temperature. The red laser diodes of the comparative laser leveling tool were turned. As the waste heat building up inside, the pendulum temperature increased and stabilized at around 62° C. At that point, the laser diodes stopped emitting visible light. FIG. 4 shows by curve C1 the temperature-time relation of this comparative laser leveling tool.

On the other hand, FIG. 4 shows by curve C2 the temperature-time relation of the laser leveling tool 1 of the disclosure. The MCU 10 with adaptive (smart) thermal control switched the operation of the laser diodes from continuous mode to pulse mode when the internal temperature reading of the thermal sensor 13 reaches 45° C. at the point "A" in FIG. 4. In pulse mode, the amount of waste heat produced was reduced and the equilibrium temperature was about 52° C. This is about 10° C. below the temperature reached by the comparative laser leveling tool, well below the shutdown temperature of the red laser diodes.

It can be appreciated from the comparison that, in an environment at high temperature, for example, higher than 40° C., such as at 45° C., the laser leveling tool without adaptive thermal control cannot operate for a long time. On the other hand, the laser leveling tool 1 with the adaptive thermal control of the disclosure can operate in the same environment indefinitely, until the battery 12 runs out.

The laser leveling tool 1 shown in FIG. 1 is a self-leveling type laser leveler since the orientation of the laser leveling tool 1 can be adjusted by the adjustable legs 5. It is appreciated that the adaptive thermal control of the disclosure is applicable in other types of laser leveling tools.

According to a further development of the disclosure, multiple operation modes in addition to the adaptive thermal control mode described above may be stored in the MCU 10. In this condition, a user selectable control interface is provided for selecting the operation mode based on a particular need during operation.

In the embodiment shown in FIG. 2, the HMI 14 forms the user interface. The HMI 14 may be provided in the top portion of the tool main body 2. The top portion is substantially horizontal in most operations and faces upwards, so the user can read information from and inputs instructions via the HMI 14 easily. The HMI 14 may comprise switches and/or a touch panel on the tool main body 2. In this case, at least one selection interface for selecting operation modes is needed. The HMI 14 may also comprise light-emitting diodes as indication. Operation information of the laser leveling tool 1, such as the visibility of laser lines, the number of laser lines to be emitted, the remaining battery capacity, can be indicated by the light-emitting diodes.

As an additional or alternative option to the HMI 14, the operation mode can be selected by using a smartphone with customized APPs. The smartphone and APPs implementation can be Bluetooth or WiFi communication technologies as the means of connectivity. In this case, a Bluetooth or WiFi module is needed inside the tool main body 2 to accept the command. Operation information of the laser leveling tool 1 can be displaced on the screen of the smartphone.

Figure 5:
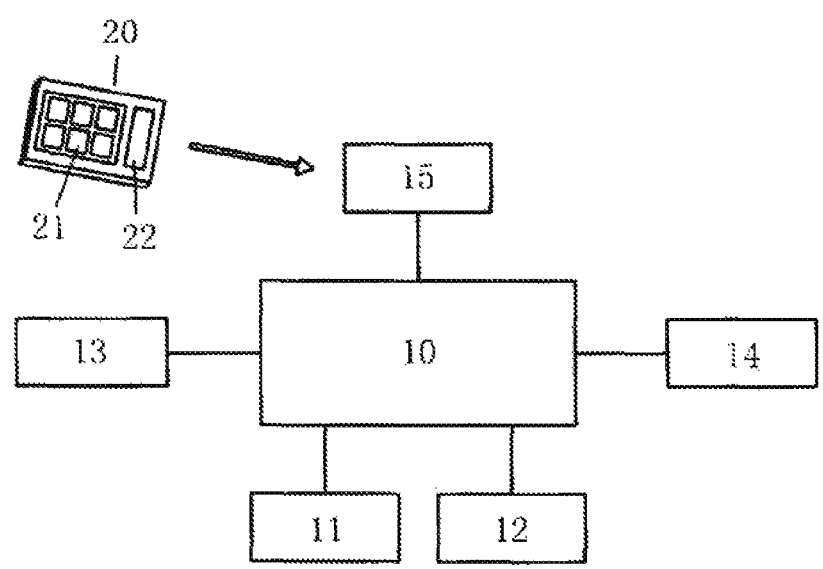
FIG. 5 is a block diagram of a user selectable control interface of the laser leveling tool according to a possible embodiment of the disclosure.

As an additional or alternative option to the HMI 14 and the smartphone, the operation mode can be selected by using IRDA or RF technology. In this case, the tool main body 2 may comprise an appropriate sensor or signal receiver 15 which is connected with the MCU 10, and a remote control 20 may have an appropriate communication module for establishing communication between it and the MCU 10, as shown in FIG. 5. The remote control 20 also comprises keys 21 and/or a screen 22 for inputting instructions/displaying the instructions and the operation information of the laser leveling tool 1.

The laser leveling tool 1 may comprise one or more of the above described user interfaces. By using one of these user interfaces, operation modes of the laser leveling tool 1, including enabling/disabling the adaptive thermal control, can be selected by the user.

While the disclosure has been shown and described in relation to certain embodiments, the disclosure is not intended to be limited to the illustrated details. Rather, various details of the disclosure can be modified within the scope of the claims and their equivalents.

The invention claimed is:

1. A laser leveling tool comprising:
at least one laser diode configured to emit a laser beam;
a micro controller unit (MCU) configured to control an operation of the at least one laser diode; and
a thermal sensor configured to sense an internal temperature of the laser leveling tool;
wherein the MCU is configured to operate the at least one laser diode with a reduced operation power in response to the internal temperature reaching a temperature threshold.

2. The laser leveling tool of claim 1, wherein the temperature threshold is 10 to 25° C. lower than a permitted highest operation temperature of the at least one laser diode.

3. The laser leveling tool of claim 1, wherein the temperature threshold is about 45° C.

4. The laser leveling tool of claim 1, wherein:
the temperature threshold includes at least two different temperature thresholds corresponding to at least two different reduced operation power levels of the at least one laser diode, and
the MCU is configured to operate the at least one laser diode with one of the at least two different reduced operation power levels in response to the internal temperature reaching a corresponding one of the at least two different temperature thresholds.

5. The laser leveling tool of claim 1, wherein the MCU is configured to operate the at least one laser diode with the reduced operation power by lowering an operation duty cycle or an electric current of the at least one laser diode.

6. The laser leveling tool of claim 1, further comprising:
a battery configured to operate as a power source of the laser leveling tool,
wherein the MCU is configured to operate the at least one laser diode with the reduced the operation power in response to a remaining capacity of the battery falling below a battery capacity threshold.

7. The laser leveling tool of claim 1, wherein the MCU is configured to require the user's permission before it operates the at least one laser diode with the reduced operation power.

8. The laser leveling tool of claim 6, wherein the MCU is configured to calculate a permitted operation time for the remaining battery capacity under a certain operation power of the at least one laser diode.

9. The laser leveling tool of claim 1, wherein:
the laser diode comprises one or more laser diodes mounted to a pendulum, and
the thermal sensor is attached to the pendulum or mounted to be near the pendulum to measure a temperature of the pendulum or a temperature in a proximity of the pendulum.

10. The laser leveling tool of claim 1, further comprising:
an adaptive thermal control firmware stored in the MCU or in a memory that can be read by the MCU, that is executed by the MCU to operate the at least one laser diode with the reduced operation power based on the sensed internal temperature.

11. The laser leveling tool of claim 1, wherein the laser leveling tool is of a self-leveling type and further comprises:
a seat having adjustable legs configured to adjust an orientation of the laser leveling tool.

12. The laser leveling tool of claim 1, further comprising:
a user selectable control interface configured to enable a user to select an operation mode of the laser leveling tool, the user selectable control interface comprising one or more of:
   a human-machine interface (HMI) provided on a main body of the laser leveling tool;
   an IRDA or RF type remote control interface; and
Bluetooth or WiFi connectivity for establishing communication with a smartphone with customized APPs.

* * * * *

UNITED STATES PATENT AND TRADEMARK OFFICE
CERTIFICATE OF CORRECTION

PATENT NO. : 10,591,296 B2
APPLICATION NO. : 15/661106
DATED : March 17, 2020
INVENTOR(S) : Yat Shan Kwan, Wah Pong Chan and Eric Hung-Ying Yuen Page 1 of 1

It is certified that error appears in the above-identified patent and that said Letters Patent is hereby corrected as shown below:

In the Claims

In Claim 10, at Column 6, Line 59, (approx.) insert --,-- between the words "firmware" and "stored".

Signed and Sealed this
Twenty-fifth Day of August, 2020

Andrei Iancu
*Director of the United States Patent and Trademark Office*